Oct. 4, 1966 R. J. MEDFORD 3,276,927
SMOOTHING OF MECHANICALLY DRILLED HOLES
Filed July 1, 1963
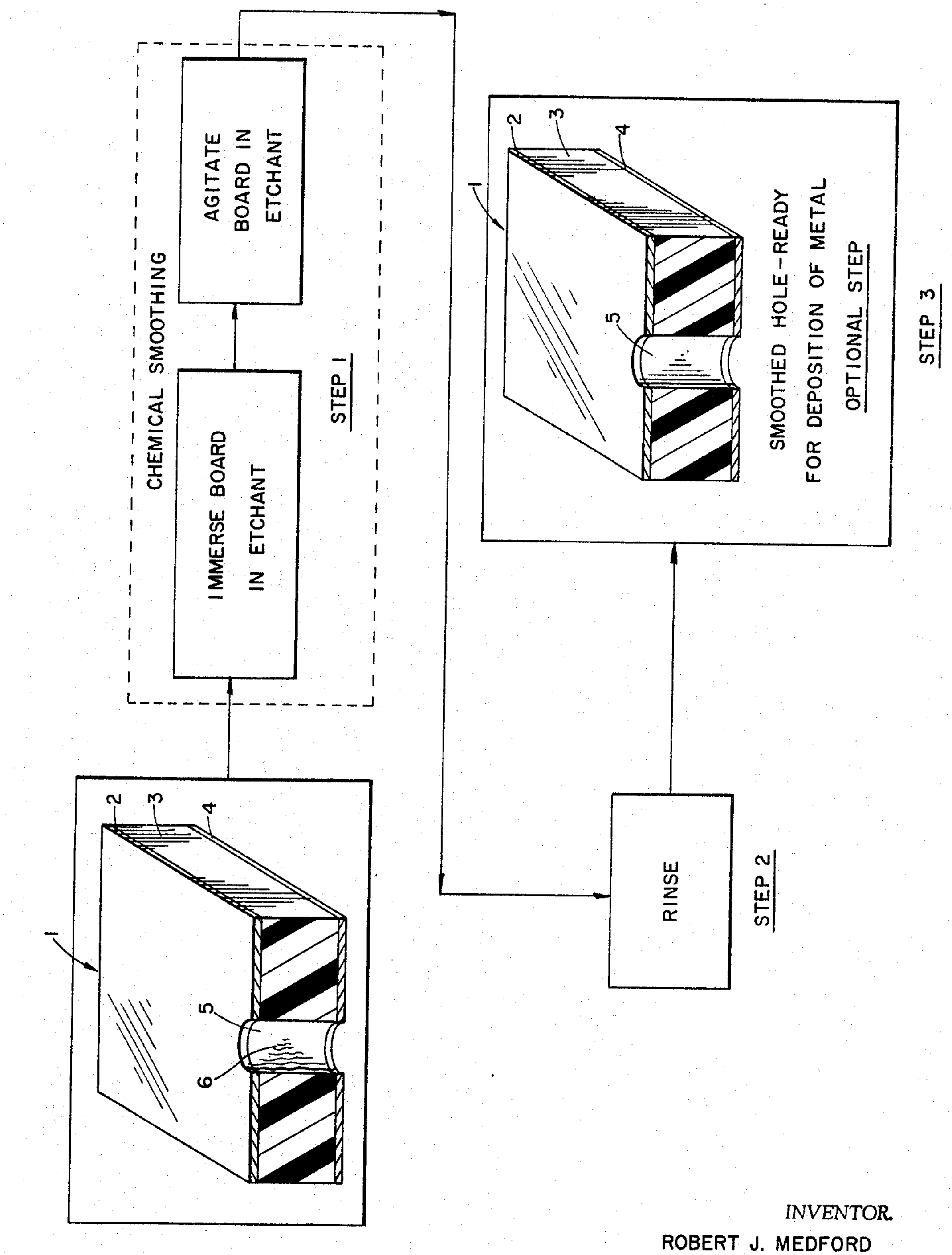
INVENTOR.
ROBERT J. MEDFORD
BY L. Lee Humphries
ATTORNEY United States Patent Office 3,276,927

Patented Oct. 4, 1966

3,276,927

SMOOTHING OF MECHANICALLY DRILLED HOLES

Robert J. Medford, Los Angeles, Calif., assignor to North American Aviation, Inc.

Filed July 1, 1963, Ser. No. 291,749
3 Claims. (Cl. 156—3)

This invention relates to a method for smoothing mechanically drilled holes in a two sided single dielectric layer circuit board and more specifically to a method for smoothing mechanically drilled holes in a two sided single dielectric layer circuit board by chemical etching.

Mechanically drilled holes in printed circuit boards have a tendency to form nodules to hole wall surface projections in plated through holes. The larger nodules impair solderability and thereby reduce reliability for circuits soldered on the circuit boards. The nodule build-up results from projections present on the walls of mechanically drilled holes. Current process steps utilized in producing circuit boards do not effectively smooth the projections inside the mechanically drilled roles.

This invention is comprised of the steps of mechanically drilling holes in a two sided single layer circuit board or selecting a board having holes mechanically drilled therethrough and immersing the board into a heated fluosulfonic acid etchant for a length of time suitable to reduce projections on the hole walls. While the board is immersed, it is agitated by suitable means such as an air driven stirrer, sprayer, air agitator, ultrasonic agitator, or mechanical reciprocator (both lateral and vertical), or a combination of these. After the immersion and agitation for a length of time sufficient to reduce the rough areas on the wall surfaces, the boards are rinsed to remove etchants and residues.

It is an object of this invention to provide a process for reducing projections present on the walls of mechanically drilled holes.

Another object of this invention is to provide a process for smoothing of surfaces of mechanically drilled holes by use of a chemical etchant.

Another object of this invention is to provide a process for smoothing of surfaces of mechanically drilled holes by agitating the board in a chemical etchant heated to a selected temperature.

Still another object of this invention is to provide a process for reducing hole wall projections by immersing the board into a fluosulfonic etchant heated to a predetermined temperature and by agitating the board while so immersed.

It is another object of this invention to provide a process for improving the reliability of circuit boards having drilled holes.

It is still another object of this invention to provide a process for smoothing hole walls at production rates.

These and other objects of the invention will become apparent from the following description taken in connection with the accompanying drawings, in which FIG. 1 is a schematic illustration of the steps which comprise the process, including an illustration of a two sided single layer circuit board progressing through each step.

Circuit board 1 having a mechanically drilled hole 5 or holes, as the case may be, is shown in FIG. 1. Projections 6 of hole 5 are present along the inside of the hole walls. Circuit board 1 is comprised of three layers, layers 2 and 4 of which are metal such as copper, copper alloy, gold, gold alloy, etc. Layer 3 is comprised of a dielectric, usually epoxy-glass, plastics, or other types of dielectric material. Board 1 may also be comprised of one layer of dielectric and one layer of metal. In step 1 shown in FIG. 1 projections 6 inside hole 5 are chemically smoothed. The board is first immersed into a heated fluosulfonic etchant and then agitated, The fluosulfonic ($H_2SO_4$—HF) etchant is preferably comprised of two parts $H_2SO_4$ (having a concentration of from 93% to 98%—preferred 95%) and one part HF (having a range from 70% to 100%—preferred 70%) and the etchant is preferably heated and maintained at a temperature in a range of 136° F. to 142° F.

Another preferred etchant is 30% to 45% by weight of $H_2SO_4$ (93% concentration), 25% to 31% by weight of HF (70% concentration), 14% to 24% by weight of $HSO_3F$ (98.5% concentration) and water maintained at a temperature within the range of 110° F. to 148° F. (preferred 116° F. to 120° F.). This etchant reduces the formation of sulfones and other derivatives from the smoothed hole surface. The boards are preferably agitated horizontally at a rate of approximately six feet per minute and remain in the solution until smoothed, approximately fifteen to thirty seconds. Other means of agitation such as a rotating air driven stirrer, ultrasonics, air, or spray agitator may also be used successfully. A preferred rate for ultrasonic agitation was found to be twenty to twenty-five kilocycles for holes having a diameter of 0.052 inch. Ultrasonic agitation rate increases with decreasing hole diameter. After being smoothed the boards are rinsed with water to remove residues.

A series of tests were conducted to determine a range of etchant temperatures, speed of agitation, and smoothing time. An etchant comprised of two parts $H_2SO_4$ (having a concentration range of 93% to 98%) and one part HF (having a concentration range of 70% to 100%) was used in connection with the data contained in Table I. Other etchants listed in Table II have also been tested successfully in connection with the smoothing process.

The boards were agitated during the experiment by means of an air driven stirrer or by means of a reciprocating mechanical work rod driven by a variable speed reciprocating motor as indicated. Speed was measured by counting the number of revolutions for an interval of time in the case of the stirrer and counting the distance linearly traveled by the rod for an interval of time in the case of the mechanical work rod.

Circuit boards approximately two inches wide, six inches long, and 0.0625 inch thick having hole diameters of 0.052 inch, having two ounce copper clad on both sides of an epoxy-glass dielectric were used in the series of tests which were conducted in obtaining the data in Table I. Other tests were conducted on boards having thickness from 4 to 8 milliinches. The boards were mechanically drilled. The chemical etchant was contained in a five hundred milliliter polyethylene beaker and the temperature was maintained by means of a hot water bath.

TABLE I

| Board No. | Bath Temp. in Degrees Farenheit | Etching Time (secs) | Agitation Speed |
|---|---|---|---|
| 1 | 85 | 40 | 60 r.p.m. |
| 2 | 71 | 60 | 60 r.p.m. |
| 3 | 185 | 30 | 6 r.p.m. |
| 4 | 111 | 30 | None. |
| 5 | 97 | 60 | Do. |
| 6 | 97 | 60 | 6 ft./min.—Linear. |
| 7 | 97 | 30 | None. |
| 8 | 96 | 60 | Do. |
| 9 | 96 | 60 | 6 ft./min.—Linear. |
| 10 | 97 | 35 | Do. |
| 11 | 107 | 60 | None. |
| 12 | 126 | 15 | 6 ft./min.—Linear. |
| 13 | 150 | 15 | Do. |
| 14 | 142 | 15 | Do. |
| 15 | 136 | 15 | Do. |
| 16 | 136 | 30 | Do. |
| 17 | 136 | 60 | Do. |
| 18 | 136 | 75 | Do. |
| 19 | 142 | 30 | Do. |
| 20 | 142 | 60 | Do. |
| 21 | 142 | 90 | Do. |

The boards 1 through 11 indicated a fair amount of smoothing of projections 6. Boards 12 through 22 illustrated good and excellent projection reduction. Photographs were taken before and after each experiment for comparison purposes.

The time, speed of agitation, and temperature are interrelated with the type of material being etched and with the degree of cure of that material. Time required to smooth the hole wall is directly proportional to the thickness of the board, for example, boards having a thickness of .0625 inch may be smoothed in approximately sixty seconds whereas boards having a thickness of .004 inch may require only four or five seconds for smoothing depending on the factors indicated above.

Etchants listed in Table II were also tested with boards comprised of various epoxys, epoxy-glasses, phenolics, etc.

TABLE II

| Etchants | Concentration Percent by Weight | Solution Temperature Fahrenheit | Dielectric Materials Etched |
|---|---|---|---|
| 1. Sulfuric acid | 60.0 | 78 | Epoxy-glass. |
| Hydrofluoric Acid | 1.3 | | |
| Water | 38.7 | | |
| 2. Sulfuric Acid | 60.0 | 78 | Epoxy-glass. |
| Hydrofluoric Acid | 11.0 | | |
| Water | 29.0 | | |
| 3. Hydrofluoric Acid | 36.0 | 78 | Epoxy-glass. |
| Ammonium Persulfate | 10.0 | | |
| Water | 54.0 | | |
| 4. Hydrofluoric Acid | 27.0 | 78 | Epoxy-glass. |
| Ammonium Persulfate | 26.0 | | |
| Water | 47.0 | | |
| 5. Hydrofluoric Acid | 28.0 | 78 | Epoxy-glass. |
| Acetone | 42.0 | | |
| Water | 30.0 | | |
| 6. Acetic Acid | 36.0 | 78 | Epoxy-glass. |
| Hydrofluoric Acid | 11.0 | | |
| Acetone | 27.0 | | |
| Water | 26.0 | | |
| 7. Acetic Acid | 37.0 | 150 | Epoxy-glass |
| Acetyl Acetone | 35.0 | | |
| Acetone | 28.0 | | |
| 8. Acetyl Acetone | 24.0 | 78 | Epoxy-glass. |
| Hydrofluoric Acid | 11.0 | | |
| Potassium Iodide | 25.0 | | |
| Water | 40.0 | | |
| 9. Propylene Oxide | 100.0 | 78 | Epoxy-glass. |
| 10. Sodium Hydroxide | 20.0 | 78 | Epoxy-glass. |
| Lithium Carbonate | 20.0 | | |
| Water | 60.0 | | |
| 11. Sulfuric Acid | 15.0 | 78 | Epoxy glass. |
| Propylene Oxide | 26.0 | | |
| Water | 59.0 | | |
| 12. Sulfuric Acid | 48.0 | 194 | Epoxy-glass. |
| Nitric Acid | 31.0 | | |
| Water | 21.0 | | |
| 13. Hydrochloric Acid | 38.0 | 78 | Epoxy-glass. |
| Water | 62.0 | | |
| 14. Hydrofluoric Acid | 37.0 | 78 | Epoxy-glass. |
| Water | 63.0 | | |
| 15. Sulfuric Acid | 40.0 | 135 | Epoxy-glass. |
| Hydrofluoric Acid | 17.5 | | |
| Nitric Acid | 23.0 | | |
| Water | 19.5 | | |
| 16. Sulfuric Acid | 95.0 | 78 | Epoxy-glass. |
| Water | 5.0 | | |
| 17. Nitric Acid | 69.7 | 78 | Epoxy-glass. |
| Water | 30.3 | | |
| 18. Sulfuric Acid | 95.0 | 160 | Epoxy-glass. |
| Water | 5.0 | | |
| 19. Nitric Acid | 69.7 | 130 | Epoxy-glass. |
| Water | 30.3 | | |
| 20. Sulfuric Acid | 54.0 | 150 | Epoxy-glass. |
| Fluoboric Acid | 21.0 | | |
| Water | 25.0 | | |
| 21. Sulfuric Acid | 60.0 | 78 | Epoxy-glass. |
| Hydrofluoric Acid | 26.0 | | |
| Water | 14.0 | | |
| 22. Sulfuric Acid | 73.5 | 75–142 | Epoxy-glass. |
| Hydrofluoric Acid | 16.0 | | |
| Water | 10.5 | | |
| 23. Sodium Hydroxide | 10–60 | 80–190 | Polyester. |
| 24. Sulfuric Acid ($H_2SO_4$) | 30–45 | 110–148 | |
| Hydrofluoric Acid (HF) | 25–31 | | |
| Fluosulfonic Acid ($HSO_3F$) | 14–24 | | |

Etchants used in this smoothing process were developed in connection with the Process for Chemical Drilling of Circuit Boards filed approximately April 1, 1963 having Serial Number 269,453.

The boards, after being chemically smoothed, were rinsed, in step two, preferably for approximately one minute to remove etchant residue. The rinsing of the boards could be extended or shortened depending on the degree of cleanliness desired, the velocity of the spray hitting the board and the amount of spray involved. A range for rinsing the boards could extend from a few seconds to several minutes depending on the aforementioned parameters. The boards were ready as seen in step three for deposition of metal along the hole walls after rinsing. Hole 5 is shown with smooth hole walls. Copper was deposited, although not required to practice this invention, on the smoothed hole wall of some boards.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A process for chemically smoothing mechanically drilled holes in a laminated circuit board having at least three layers, a top, an intermediate, and a bottom layer, said top and bottom layers being comprised of a metallic material, said intermediate layer being comprised of an epoxy-glass dielectric material, comprising the following steps, immersing said laminated circuit board in a fluosulfonic etchant for a sufficient length of time to smooth hole wall projections by the use of said chemical etchant, said fluosulfonic etchant comprising approximately two parts $H_2SO_4$ having a concentration of from 93% to 98% and approximately one part HF having a range of from 70% to 100% and wherein said temperature is maintained within the range of from 136° F. to 142° F., and rinsing said boards.

2. A process for chemically smoothing mechanically drilled holes in a laminated circuit board having at least three layers, a top, an intermediate, and a bottom layer, said top and bottom layers being comprised of a metallic material, said intermediate layer being comprised of an epoxy-glass dielectric material, comprising the following steps, immersing said laminated circuit board in a fluosulfonic etchant for a sufficient length of time to smooth hole wall projections by the use of said chemical etchant, said fluosulfonic etchant comprising 34% to 40% by weight of $H_2SO_4$ having a concentration of approximately 93% and 17% to 21% by weight of $HSO_3$ having a concentration of approximately 98.5%, 28% to 29% by weight of HF having a concentration of 70% and wherein said temperature is maintained within a range of 110° to 148° F.; and rinsing said boards.

3. A process for chemically smoothing mechanically drilled holes in a laminated circuit board having at least three layers, an intermediate, a top, and a bottom layer, said top and bottom layers being comprised of a metallic material, said intermediate layer being comprised of an epoxy-glass dielectric material, comprising the following steps, immersing said laminated circuit board in a fluosulfonic etchant for approximately fifteen to ninety seconds, said fluosulfonic etchant comprising approximately two parts $H_2SO_4$ having a concentration of from 93% to 98% and approximately one part HF having a range of from 70% to 100% and wherein said temperature is maintained within the range of from 136° F. to 142° F.;

agitating said boards at a rate of approximately from 0 to 6 feet per minute horizontally; and, rinsing said boards.

References Cited by the Examiner

UNITED STATES PATENTS

| | | | |
|---|---|---|---|
| 2,337,062 | 12/1943 | Page | 156—18 X |
| 2,411,298 | 11/1946 | Shore | 171—327 |
| 3,186,883 | 6/1965 | Frantzen | 156—7 |

ALEXANDER WYMAN, *Primary Examiner.*

JACOB STEINBERG, *Examiner.*